US007375353B2

(12) United States Patent
Neerhof et al.

(10) Patent No.: US 7,375,353 B2
(45) Date of Patent: May 20, 2008

(54) LITHOGRAPHIC APPARATUS AND DEVICE MANUFACTURING METHOD

(75) Inventors: Hendrik Antony Johannes Neerhof, Eindhoven (NL); Hako Botma, Eindhoven (NL); Marius Ravensbergen, Bergeijk (NL)

(73) Assignee: ASML Netherlands B.V., Veldhoven (NL)

( * ) Notice: Subject to any disclaimer, the term of this patent is extended or adjusted under 35 U.S.C. 154(b) by 272 days.

(21) Appl. No.: 11/224,303

(22) Filed: Sep. 13, 2005

(65) Prior Publication Data

US 2007/0057201 A1    Mar. 15, 2007

(51) Int. Cl.
*G03F 7/20* (2006.01)
*G03B 27/72* (2006.01)

(52) U.S. Cl. ............... 250/492.2; 355/53; 355/67; 355/68; 355/71; 378/34

(58) Field of Classification Search ............... None
See application file for complete search history.

(56) References Cited

U.S. PATENT DOCUMENTS

| 5,315,629 | A  | * | 5/1994 | Jewell et al. ............... 378/34 |
| 2003/0063266 | A1 | * | 4/2003 | Leenders et al. ............ 355/53 |
| 2005/0134818 | A1 | * | 6/2005 | Van Dijsseldonk et al. ... 355/55 |
| 2005/0140957 | A1 | * | 6/2005 | Luijkx et al. ............... 355/71 |

* cited by examiner

*Primary Examiner*—Jack I Berman
(74) *Attorney, Agent, or Firm*—Pillsbury Winthrop Shaw Pittman, LLP

(57) ABSTRACT

An attenuation adjustment device is disclosed that includes a plurality of members configured to cast penumbras in a radiation beam illuminating a patterning device in a lithography apparatus. Furthermore, an attenuation control device is provided to adjust the members in such a manner as to control the attenuation of the patterned radiation beam projected onto a target portion of a substrate across the cross-section of the patterned radiation beam. The attenuation control device includes a detector configured to provide an output indicative of the position of each member in dependence on detection of a beam of detecting radiation reaching the detector after attenuation by the member.

20 Claims, 5 Drawing Sheets ically apparatus can be used, for example, in the manufacture of integrated circuits (ICs). In that instance, a patterning device, which is alternatively referred to as a mask or a reticle, may be used to generate a circuit pattern corresponding to an individual layer of the IC, and this pattern can be imaged onto a target portion (e.g. comprising part of, one or several dies) of a substrate (e.g. a silicon wafer) that has a layer of radiation-sensitive material (resist). In general, a single substrate will contain a network of adjacent target portions that are successively exposed. Lithographic apparatus may be of the transmissive type, where radiation is passed through a mask to generate the pattern, or of the reflective type, where radiation is reflected from the mask to generate the pattern. Known lithographic apparatus include so-called steppers, in which each target portion is irradiated by exposing an entire pattern onto the target portion at once, and so-called scanners, in which each target portion is irradiated by scanning the pattern through the projection beam in a given direction (the scanning-direction) while synchronously scanning the substrate parallel or anti-parallel to this direction. It is also possible to transfer the pattern from the patterning device to the substrate by imprinting the pattern onto the substrate.

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that instance, a patterning device, which is alternatively referred to as a mask or a reticle, may be used to generate a circuit pattern corresponding to an individual layer of the IC, and this pattern can be imaged onto a target portion (e.g. comprising part of, one or several dies) of a substrate (e.g. a silicon wafer) that has a layer of radiation-sensitive material (resist). In general, a single substrate will contain a network of adjacent target portions that are successively exposed. Lithographic apparatus may be of the transmissive type, where radiation is passed through a mask to generate the pattern, or of the reflective type, where radiation is reflected from the mask to generate the pattern. Known lithographic apparatus include so-called steppers, in which each target portion is irradiated by exposing an entire pattern onto the target portion at once, and so-called scanners, in which each target portion is irradiated by scanning the pattern through the projection beam in a given direction (the scanning-direction) while synchronously scanning the substrate parallel or anti-parallel to this direction. It is also possible to transfer the pattern from the patterning device to the substrate by imprinting the pattern onto the substrate.

In general, there is a non-uniformity in the intensity of radiation which is imaged onto the substrate in such apparatus. This is typically caused by, for example, the mirrors or lenses of the projection system having differing reflectivity or transmission over their surfaces. In the case of conventional lithography, so-called deep-UV (DUV), a transmissive filter is included which corrects for this non-uniformity. In the past the properties of the filter were fixed and could not be changed over time. In newer systems the filter is adjustable, and can be adjusted to take account of slow variations in beam uniformity, for example caused by gradual degradation of lens surfaces.

A known adjustable uniformity correction unit for DUV comprises two transmissive plates which are considerably bigger than the projection beam. Different transmission profiles are provided on the plates, so that, when the transmission of the plate is to be adjusted, the point at which the projection beam intercepts the plate is changed by moving the plate. The plates are made from glass and are heavy, consequently their movement is slow. In any event, they are designed and intended to be used to correct for very slow variations.

In extreme ultraviolet (EUV) lithography, there are no materials available which can be used in a transmissive way. Accordingly an arrangement is disclosed in U.S. Pat. No. 6,741,329 in which non-transmissive blades, commonly called venetian blinds ('blades'), are used to adjust the beam to correct for non-uniformity in the intensity of radiation imaged onto the substrate. In the simplest case the blades are in the form of a series of rectangles that are rotatably mounted and are spread across the projection beam. In more complicated cases the blades can have a more complicated ('asymmetric blades') shape. In order to reduce the beam intensity in a given location, the blade at that location is rotated so that it partially blocks the beam. The blades are typically located a distance $D \geq B/\tan(\mathrm{asin}(NA))$ mm below the reticle where B is the distance between the blades and NA is the numerical aperture at reticle level. If the blades were to be located closer to the reticle, then sharp images of the blade edges would appear on the substrate. Conversely, if the blades were to be moved further away from the reticle, then the spatial frequency of the intensity correction provided by the blades would be reduced.

The blade arrangement of U.S. Pat. No. 6,741,329 does not allow the uniformity or the intensity of the radiation incident on the substrate to be varied in the direction in which the substrate is scanned by the projection beam during a scan. Instead the energy per laser pulse is varied during the scan to generate a varying intensity profile in the scanning direction. However, unlike DUV lithography sources, EUV lithography sources are not capable of changing their output power, and there is therefore no simple way in which the overall intensity of the projection beam incident on the substrate can be varied.

The illumination slit that is used to expose the substrate during scanning is usually curved, as shown in FIG. 2. The blades are oriented with a fixed angle of typically around 60 degrees with respect to the non-scanning direction or x-axis. Due to this angle the shadow of each blade is beneficially spread out in the non-scanning x-direction. Since the overlap of the blades with the slit is different on the left hand side to the right hand side of the slit the transmittance of the blades is not the same. The blade on the left hand side of FIG. 2 is more nearly perpendicular to the slit, leading to a narrower spatial profile with a relatively low transmission, whereas the blade on the right hand side of FIG. 2 is more nearly parallel to the slit, leading to a broader spatial profile with a relatively high transmission. By rotating the blades progressively less from left to right with respect to the x-axis, their peak transmission can be made the same. For example, at the left hand end of the slit the blades may be mounted at 60° relative to the x-axis, whereas at the right hand side of the slit the blades may be mounted at 45° relative to the x-axis.

In order to detect the positions of the blades for the purpose of controlling the amount of attenuation applied by the blades, each blade may have an associated position detector to detect a quantity of radiation received from a radiation source providing a radiation beam that is arranged to be interrupted by a portion of the blade, or an element connected to the blade so as to rotate with the blade in such a manner that the quantity of radiation reaching the position detector is indicative of the orientation of the blade. The outputs of the position detectors can then be supplied to an electronic controller to control the actuators, used to tilt the blades, in such a manner as to accurately orient the blades according to the degree of attenuation desired. Generally the number of radiation sources used in such a position detection arrangement will correspond to the number of blades whose positions are to be detected. Thus, if in a typical arrangement 30 blades are provided, the position detection arrangement may include, for example, 30 radiation-emitting diodes to emit radiation and 30 photodiodes to detect the radiation after attenuation by the blades. All the components may be disposed in a vacuum so that, because of the lack of convection, cooling can present a problem.

When a high measurement accuracy is required, the use of multiple radiation sources can be disadvantageous in that the intensity of radiation emitted can vary from source to source and with time depending on the different thermal behavior of each source, which may cause the relationship between the proportion of radiation received by each detector and the precise orientation of the blade, as well as the angular distribution of the radiation and the degree of self-heating, to vary from source to source. The thermal drift of the radiation emitting diodes can also render these unsuitable for use in high measurement accuracy system. The use of multiple radiation sources is also disadvantageous in so far as it requires use of a high level of components and cabling, as well as providing high power consumption and cooling requirements.

SUMMARY

An aspect of one or more embodiments of the present invention is to provide a novel lithographic apparatus enabling high measurement accuracy in the control of the intensity of the projection beam incident on the substrate.

According to an aspect of the present invention, there is provided a lithographic apparatus including an illumination system configured to condition a radiation beam, a support constructed to support a patterning device, the patterning device being constructed to impart a cross-sectional pattern to the radiation beam to form a patterned radiation beam, a substrate table constructed to hold a substrate, a projection system configured to project the patterned radiation beam onto a target portion of the substrate, an intensity adjustment device disposed in the radiation system and comprising a plurality of members for casting penumbras in the radiation beam illuminating the patterning device, and an attenuation control device for adjusting the members in such a manner as to control the attenuation of the patterned radiation beam projected onto the target portion of the substrate across the cross-section of the patterned radiation beam, the attenuation control device incorporating a respective position detector for providing an output indicative of the position of each member in dependence on detection of a beam of detecting radiation reaching the position detector after attenuation by the member, wherein the attenuation control device incorporates a common radiation source for generating the beams of detecting radiation for detecting the positions of the members.

Thus the attenuation control device, which is typically in the form of a series of venetian blinds (the 'blades'), can be used to correct for non-uniformity to a high level of accuracy, and to decrease the overall intensity of the beam. This is useful because, as previously indicated, EUV lithography sources are not capable of changing their output power. Because a single source is used to supply detecting radiation to all of the position detectors, the number of components is decreased, resulting in lower cost, more space, greater reliability and less heat generation coupled with better possibilities for cooling. Also inaccuracies due to fluctuations or temperature variations are largely avoided, and the mechanical adjustment of the arrangement becomes more straightforward.

According to a further aspect of the present invention, there is provided a lithographic apparatus including an illumination system configured to condition a radiation beam, a support constructed to support a patterning device, the patterning device being constructed to impart a cross-sectional pattern to the radiation beam to form a patterned radiation beam, a substrate table constructed to hold a substrate, a projection system configured to project the patterned radiation beam onto a target portion of the substrate, an intensity adjustment device disposed in the radiation system and comprising a plurality of members for casting penumbras in the radiation beam illuminating the patterning device, and an attenuation control device for adjusting the members in such a manner as to control the attenuation of the patterned radiation beam projected onto the target portion of the substrate across the cross-section of the patterned radiation beam, wherein at least one of the members has an asymmetric shape.

The attenuation control device may comprise a reference detector to provide a reference output in dependence on detection of a beam of detecting radiation reaching the reference detector directly from the common radiation source. The reference detector directly detects the radiation from the source and provides a reference output signal so that fluctuations of the radiation source, due to thermal drift, for example, can be compensated in an electronic control circuit.

In some embodiments the attenuation control device comprises a mixing unit to receive detecting radiation from the common radiation source and to emit a respective beam of detecting radiation through a respective aperture in the unit towards each of the members. In an embodiment, the mixing unit has reflecting walls configured to multiply reflect detecting radiation from the common radiation source towards the aperture. In this manner the characteristics of the radiation from the radiation source are scrambled due to the multiple internal reflections within the mixing unit and the amount of radiation passing through each aperture is dependent on the geometry of the mixing unit and is substantially unaffected by the source strength or other characteristics of the source.

The attenuation control device conveniently comprises a detection vane portion of each member spaced from a blade part of the member that casts a penumbra in the radiation beam illuminating the patterning device, the detection vane portion of each member configured to attenuate the beam of detecting radiation detected by the associated position detector. Although it is desired that the detection vane portion is a separate portion of the member to the blade part that casts a penumbra in the radiation beam, in an embodiment being disposed on a common shaft to the blade part, it would also be possible for the detection vane portion to be constituted by the same part of the member as the blade part.

In an embodiment, the apparatus includes a scanning system configured to provide relative movement between the patterned radiation beam and the target portion of the substrate in a scanning direction, the members being distributed along a path transverse to the scanning direction. In this case the scanning system may incorporate a curved slit extending along the path through which the patterned radiation beam is projected onto the target portion of the substrate, and the attenuation control device may be adapted to adjust the members by different amounts in such a manner that the intensity of the patterned radiation beam is substantially constant over the length of the slit.

The attenuation control device may be arranged to adjust the members in such a manner as to permit the intensity of the patterned radiation beam projected onto the target portion of the substrate to be varied both in the scanning direction and in a direction transverse to the scanning direction.

Furthermore the attenuation control device may be configured to use feedback control to control signals to the members to drive the members to the required adjustment positions according to the output signals indicative of the positions of the members received from the position detectors.

The members of the attenuation control device are typically a series of blades that are tiltable about tilt axes so as to adjust the widths of the penumbras that they cast and are disposed with their tilt axes substantially parallel to one another. In the case in which the members of the attenuation control device are in the form of venetian blinds, since the blades are very small and radiation, they may be rotated quickly and therefore may be used to provide real time uniformity correction. In general, during exposure of a target (die), radiation is scanned across the target in the Y direction. In the prior art arrangement, the non-uniformity previously measured in the Y direction could be corrected for by adjusting the intensity of the illumination provided by the DUV laser (laser pulse energy control). However, in an embodiment of the present invention, the venetian blinds blades are used in real time to adjust the uniformity. For example, during exposure of a target, the blades may be progressively rotated to compensate for a previously measured ramp in the exposure intensity (as previously mentioned, the intensity of the radiation generated by the EUV source cannot be adjusted). In addition to this, the blades may be adjusted in advance to take account of variation across the X direction, and fixed during the scan. In an alternative embodiment the positions of the blades may be varied during the scan to take account of variation in the X direction during the scan.

In general it is desired to make the intensity of the radiation incident on the substrate as uniform as possible, and to keep the same uniform intensity across the entire substrate. However, other processes that are outside the user's control, such as chemical processing of the substrate, may have an effect which varies for different locations on the substrate. Typically, there may be a difference between the center of the substrate and the edge of the substrate. An embodiment of the present invention allows for effect of these processes to be measured and then for the intensity of the beam to be adjusted to correct for this. For example, the intensity of illumination at the edge of the substrate may be controlled to be greater than the intensity of the illumination at the center of the substrate, to take account of differences in processing that occur at the edge of the substrate compared to the center of the substrate.

However, what would be even more useful would be to be able to adjust in the Y direction and also in the X direction. An embodiment of the present invention allows this to be done. Using an embodiment of the invention, specific areas of the die may be given, for example, a lower dose than other areas of the die.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts and in which.

Figure 1:
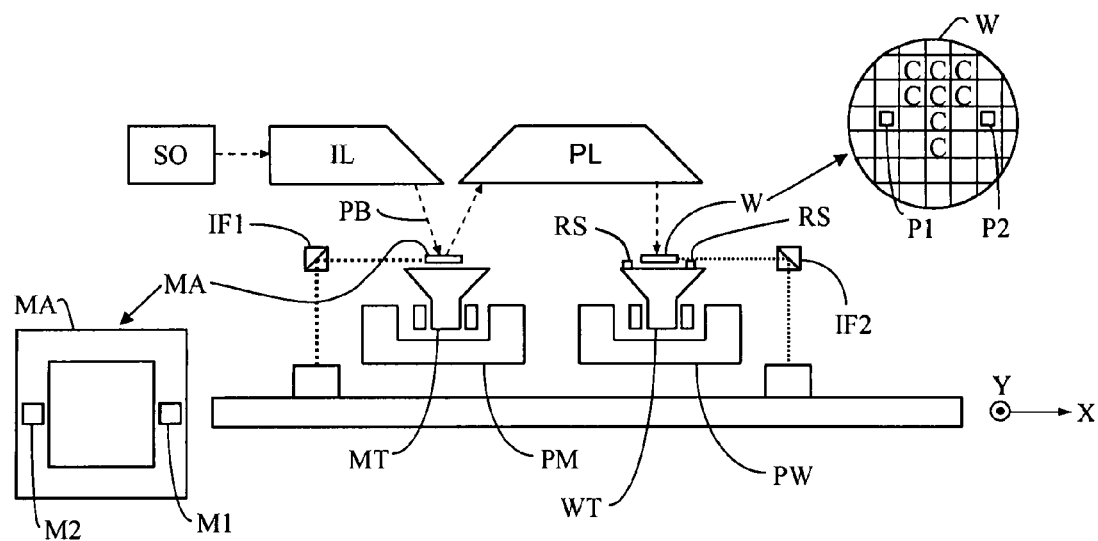
FIG. 1 diagrammatically shows a lithographic apparatus having a reflective mask.

While the invention is susceptible to various modifications and alternative forms, specific embodiments thereof have been shown by way of example in the drawings and will herein be described in detail. It should be understood, however, that this specification is not intended to limit the invention to the particular forms disclosed herein, but on the contrary, the intention is to cover all modifications, equivalents, and alternatives falling within the scope of the invention, as defined by the appended claims.

DETAILED DESCRIPTION

FIG. 1 schematically depict an example of a lithographic apparatus. The apparatus includes:

an illumination system (illuminator) IL configured to provide a projection beam PB of radiation (e.g. UV radiation);

a support structure (e.g. a mask table) MT configured to support a patterning device (e.g. a mask) MA and connected to a first positioning PM to accurately position the patterning device with respect to item PL;

a substrate table (e.g. a wafer table) WT configured to hold a substrate (e.g. a resist-coated wafer) W and connected to a second positioning device PW to accurately position the substrate with respect to item PL; and a projection system (e.g. a refractive or reflective projection system) PL configured to image a pattern imparted to the projection beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflecting mask) (e.g. employing a programmable mirror array of a type as referred to above, or employing a reflective mask). Alternatively, the apparatus may be of a transmissive type.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser, as may be the case for transmissive apparatus. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator provides a conditioned beam of radiation, referred to as the projection beam PB, having a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

In scan mode, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 2:
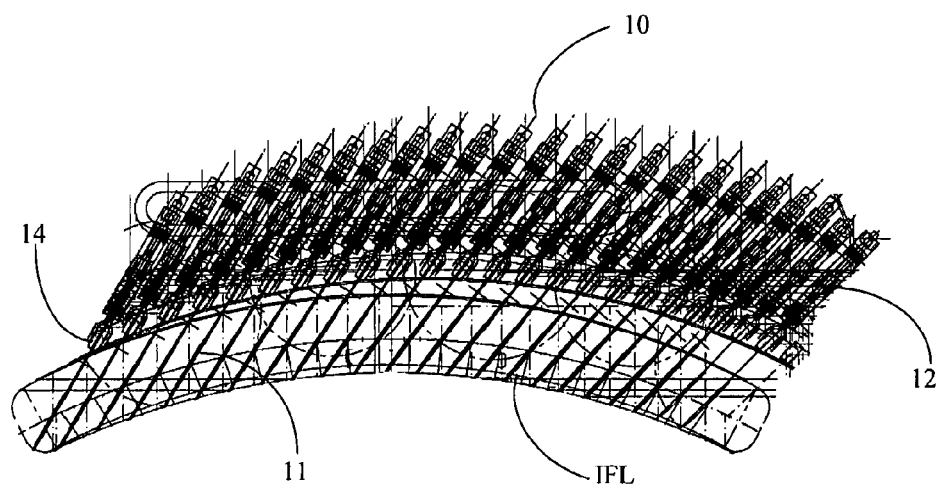
FIG. 2 is a perspective view of an attenuation control device.
Figure 4:
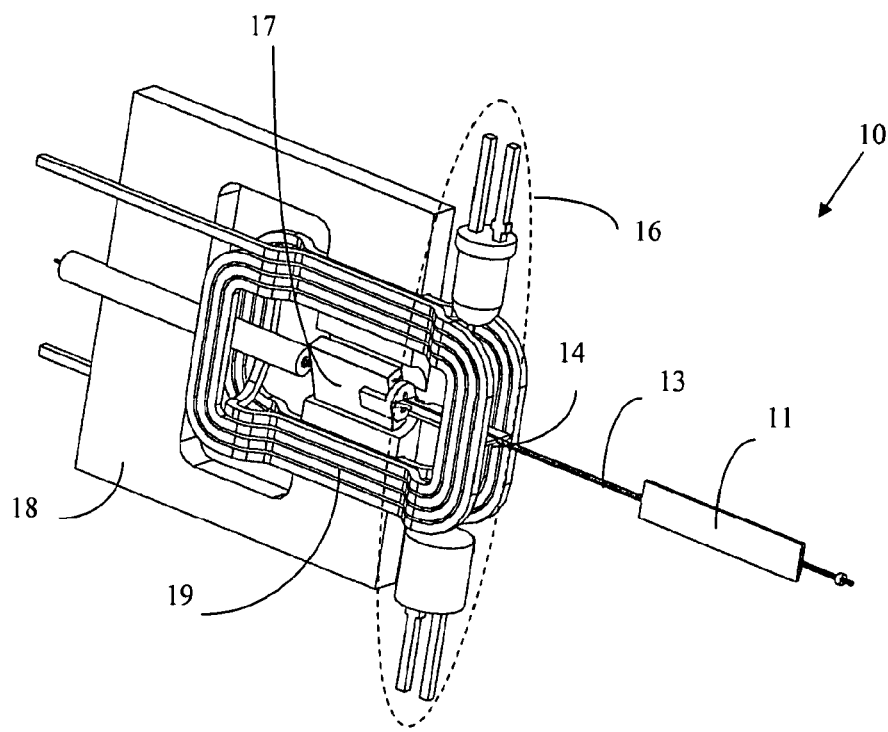
FIG. 4 is a diagram of a control arrangement for controlling the positions of the blades of an attenuation control device used in such apparatus in an embodiment of the invention.

As illustrated in FIGS. 2 and 4, an attenuation control device 10 comprises a plurality of blades 11 disposed in the illumination system IL in the path of the projection beam PB. The attenuation control device 10 is situated at an optical distance d from the mask MA, or a plane conjugate with the mask MA, such that the blades would be out of focus at mask level and also not in a pupil plane of the illumination system. In general, the attenuation control device should be closer to the mask, or a conjugate plane thereof, than to a pupil plane. If the illumination system contains an intermediate image plane, the blades may be positioned closer to that than to a pupil plane. In an illumination system utilizing field and pupil facet mirrors to provide uniformity, the attenuation control device may be positioned after the field facet mirrors.

The blades 11 extend partially or wholly across the projection beam so that their half shadows extend partially or wholly across the width of the illumination field IFL (along the scanning direction of the apparatus), substantially perpendicular to its longitudinal axis. Usually the blades extend over the whole slit but, when there is a strong telecentricity gradient near the edges of the slit, the edge area is desirably not blocked. The blades are spaced apart a distance such that their half shadows at mask level are overlapping (though it may be sufficient that they are adjacent) and must be sufficient in number so that their half shadows cover the entire illumination field. The shadow profiles of the blades tail-off and the tail portions overlap. Rotating the blades, to increase their effective widths, darkens their shadow profiles. Actuators 12 are positioned to selectively rotate the corresponding blades 11.

Rotation of one of the blades 11 from the maximally open position shown in FIG. 5(c) causes its effective width in the projection beam to increase, thereby blocking a greater portion of the incident radiation. In an embodiment, the blades are made of a material absorbent of the radiation of the projection beam so as to minimize scattered stray radiation (or have an anti-reflection coating). Accordingly, the angle of inclination of individual ones of the blades 11 can be adjusted to absorb a greater portion of incident radiation in regions of the beam where the incident intensity is higher so as to increase uniformity of illumination. The angle of the blades can be varied to reduce the intensity in the half shadow by up to about 10% without unduly affecting telecentricity. For a blade disposed at 90 mm from the mask in an apparatus with NA=0.25 and σ=0.5 using EUV radiation, the radius of the half shadow at mask level is 3 mm so that about 35 blades would be used to cover an illumination field of length 104 mm, for example. Where the blades are mounted at an angle of typically 60 degrees to the scanning direction, even less blades, i.e. 23 blades, are needed to cover the slit. In another apparatus, e.g. using DUV radiation, the stand-off distance may be a factor of 4 or 5 less.

Referring to FIG. 4, each of the blades 11 is made from molybdenum, is 10 mm long, 2 mm wide and 0.2 mm thick and is mounted on a rotatable shaft 13. Connected to the shaft 13 of each blade 11 is a vane 14 to be illuminated by visible radiation from a radiation source and having a radiation detector 16 located adjacent it. This is used to measure the orientation of the blade 11 by detecting the quantity of radiation reaching the detector 16 from the radiation source which is dependent on the orientation of the intervening vane 14. The shaft 13 is connected to a moving magnet 17 surrounded by a yoke 18 and coil 19 of a motor that is used to rotate the blade 11. One end of the collection of elements is fixed to a mounting, thereby acting as a torsion bar, and the other end is mounted in ruby bearings (not shown).

Figure 7:
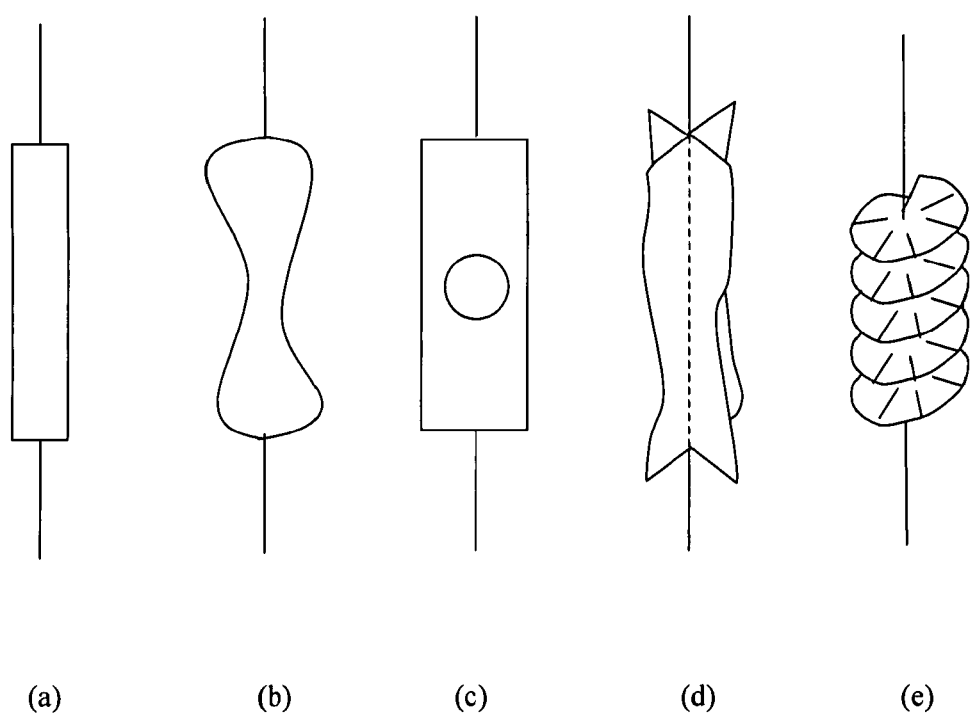
FIG. 7 shows several shapes of attenuation blade: (a) rectangular (symmetric), (b) asymmetric, (c) partially transmissive, (d) compound, and (e) 3-dimensional.

The distribution of the intensity across the slit can determine the desired shape of the attenuation blades. In general the rectangular blades in FIG. 7(a) are desired when the intensity distribution across the slit has the shape of a top hat or has linear ramps. When the intensity distribution is more Gaussian-like, an asymmetric blade, as shown in FIG. 7(b), provides the flattest intensity profile at substrate level. If the projection beam has strongly non-telecentric edges, the blades desirably are shorter so that that area is not attenuated. If the telecentricity is worst at the center or if for other reasons the center of the beam must not be disturbed, a holed blade, as shown in FIG. 7(c), may be advantageous. By placing multiple blades, e.g. 2 blades, as shown in FIG. 7(d), on a common rotation axis, widely different attenuation profiles can be generated as a function of rotation angle. The same applies to the other 3-dimensional shape, as shown in FIG. 7(e), in this case a helicoid, in that here also the position of the center of gravity of the attenuation profile can be moved by rotating the blade. In FIG. 7 a variety of blades are shown which result in good uniformity at substrate level, depending on the radiation distribution at the working level of the attenuation control device.

Figure 8:
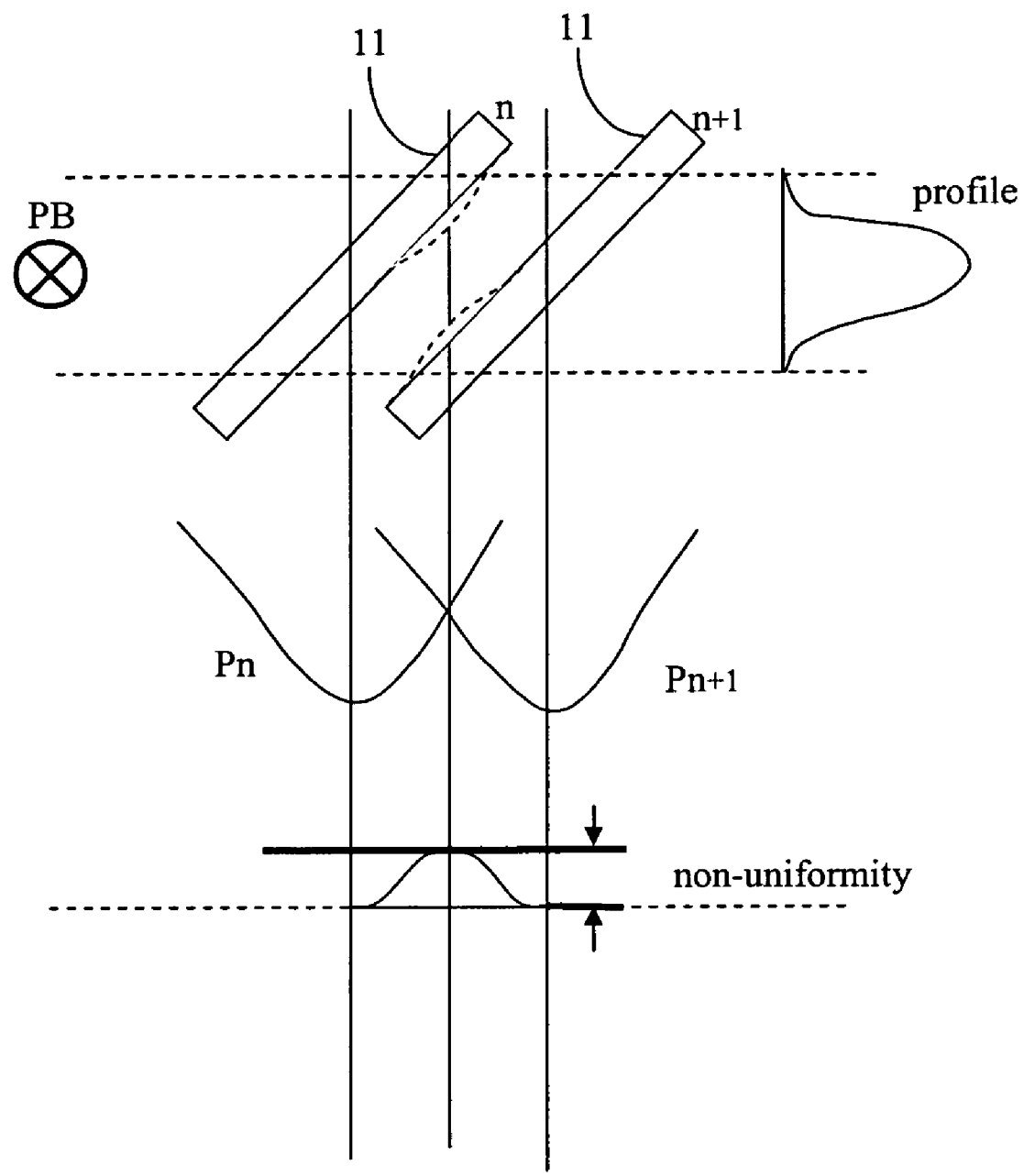
FIG. 8 illustrates an alternate embodiment of the present invention.

In FIG. 8 the projection beam PB is perpendicular to the page, its intensity cross-section is Gaussian shaped. The attenuation blades 11 numbered n and n+1 cast penumbras Pn and Pn+1 at mask level. As shown the rectangular blades n and n+1 can be rotated so that the integrated (attenuated)

intensities at positions xn and xn+1 are identical. In between the blades however there is still a residual non-uniformity due to the non-linearity of the PB cross section profile. By deviating from the rectangular blade shape, i.e. by locally widening the blade n, n+1 or both (the dashed lines on the blades) the non-uniformity between the blades can be minimized.

It will also be appreciated that the exact shape of the blades is not crucial to an embodiment of the invention, although the blades should be made as thin as possible to provide minimum obscuration at their maximally open position. The width of the blades should be determined in accordance with the accuracy of the actuators 12 to provide the desired degree of controllability over the amount of radiation absorbed.

The actuators 12 may be, for example, piezoelectric actuators or any other suitable rotary actuator. A linear actuator driving the rods via a gear arrangement is also possible.

Figure 5:
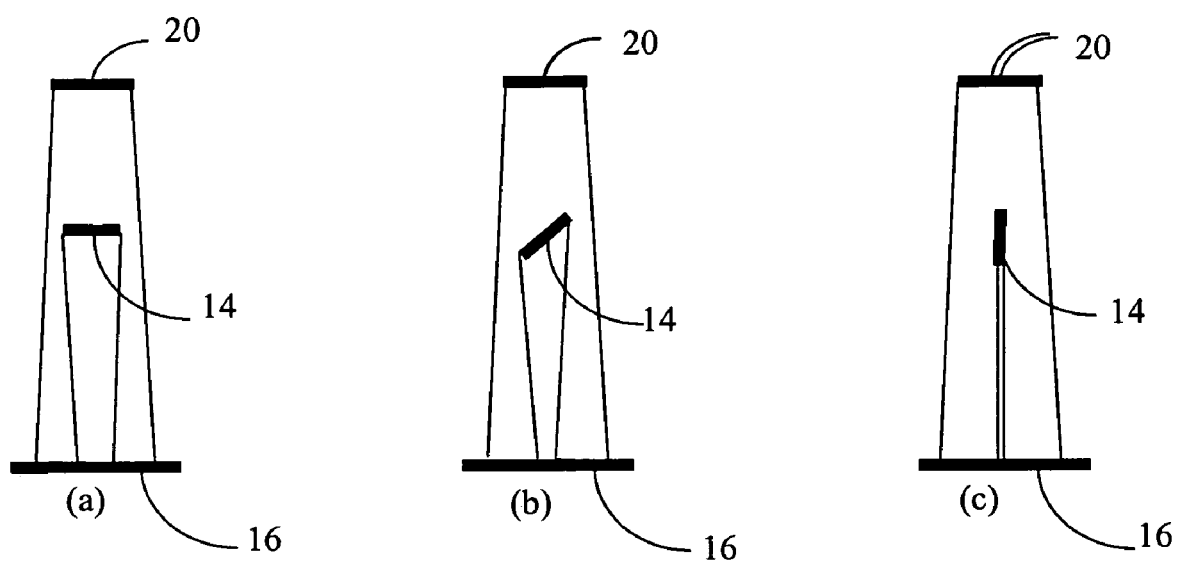
FIG. 5 shows a detail of the attenuation control device.

As shown in the three explanatory diagrams of FIG. 5, the attenuation control device incorporates a respective radiation detector 16 configured to provide an electrical output signal indicative of the orientation of each blade in dependence on detection of a beam of detecting radiation emitted by a radiation-emitting diode, for example, reaching the radiation detector 16 after attenuation by a vane 14 that may be constituted by the blade itself or may be a separate part mounted on the same shaft as the blade. The diagrams (a), (b) and (c) show how the quantity of radiation received by the detector 16 is a function of the orientation of the vane 14, although it should be appreciated that these diagrams exaggerate the range of rotation for the purposes of illustration and that the full range of rotation is more likely to be in the range of 40°, rather than 90° as shown.

In one operational mode, the attenuation control device 10 is used to correct for undesired non-uniformities in the projection beam provided by the illumination system. When used in this way, such uniformities can be measured by an appropriate sensor or by calibration runs. The appropriate blade angles to achieve the desired uniformity correction are then calculated and the actuators 12 controlled to effect this by a controller 30. The uniformity of the projection beam is then re-measured at appropriate intervals to detect any time varying non-uniformities and the blade angles adjusted as necessary. For this function the speed of response of the blade actuators is not crucial but the actuators should desirably be designed so that the blade positions can be maintained for relatively long periods without the need for constant energization of the actuators.

In another operational mode of the attenuation control device, the blades are positioned both to correct for non-uniformity and to decrease the intensity of the beam. This is particularly useful as the EUV source has no capability to vary the pulse energy over a large range (unlike DUV lasers). The uniformity of illumination is optimized by finding the point with minimum intensity and, by suitable adjustment of the blades, then cutting off all radiation above that minimum for all other positions in the slit through which the beam passes to the substrate, the excess radiation being absorbed by the blades. A similar uniformity profile, but of lower intensity, may be obtained by cutting off all radiation above a lower intensity by suitable adjustment of the blades.

In a further operational mode of the attenuation control device, the adjustment of the radiation weight blades performs uniformity correction (in direction X) and variable attenuation (in direction Y) simultaneously during scanning of a die by the projection beam through a scanning slit. In the simplest mode of operation the blades are adjusted in advance to take account of variation along the length of the slit (the X direction), and then remain fixed in these positions during scanning across the die.

In an alternative mode of operation the positions of the blades are adjusted during the scanning operation to take account of uniformity variation in the X direction during the scan.

In general it is useful to make the illumination of the substrate as uniform as possible and to keep the same uniform intensity over the entire substrate. However other processes outside the user's control, such as the chemical processing of the wafer for example, may have an effect which varies for different locations on the substrate. Typically there may be a difference between the center of the substrate and the edge of the substrate, and in this case it is possible to measure the effect of such processes and to then adjust the intensity of the beam to correct for this effect. For example, the intensity of illumination at the edge of the substrate may be controlled to be greater than the intensity of the illumination at the center of the substrate, to take account of differences in processing that occur at the edge of the substrate as compared to the center.

Alternatively the attenuation control device may be used as a two-dimensional attenuation controller. In this case the requirement is that the blades can be rotated fast, e.g., within the exposure time of a die so that there can be different corrections within a die. With the current concept of very radiation weight blades this is possible, the full range of angles (40 degrees: from −5 to plus 35 degrees) can be traveled within 0.2 sec.

Figure 3:
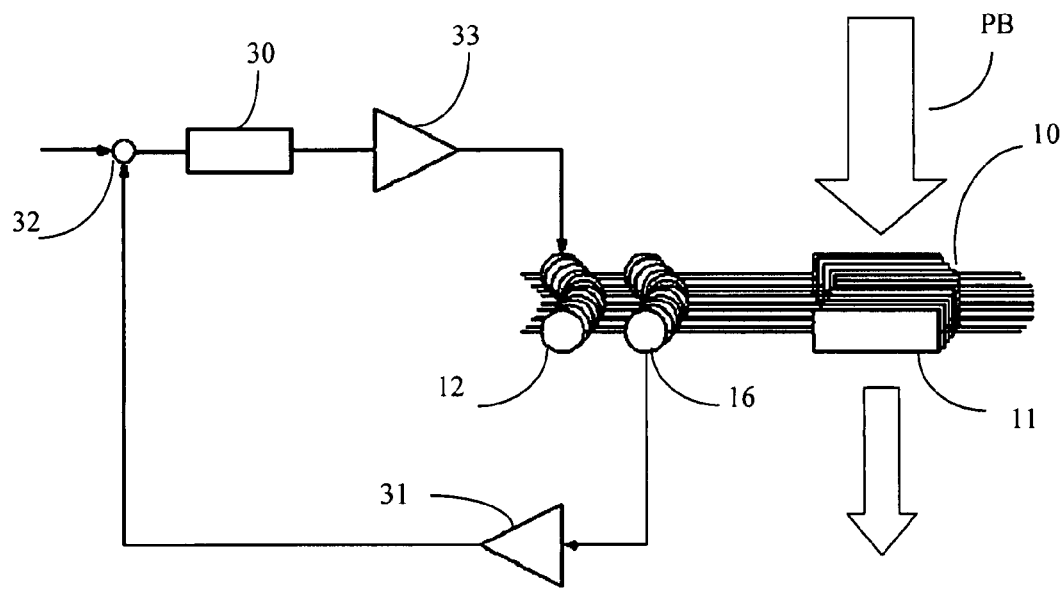
FIG. 3 is an explanatory diagram indicating the difference in the radiation received by the angle detector depending on the angle of the blade.

The control of the attenuation control device is effected by means of a 'closed-loop' control (feedback control) arrangement in which there is two-way communication between a controller 30 and the attenuation control device 10 as shown in FIG. 3 in that a respective feedback signal is sent back to the controller 30 from an angle detector 16 indicative of the orientation of each blade 11 of the attenuation control device. The feedback signal from each angle detector 16 dependent on the position of the corresponding blade 11 is transmitted through an amplifier 31 and an input of an adder 32 to the other input of which a set point signal is applied, and the controller 30 sends out an adjustment signal to a corresponding actuator 12 by way of a further amplifier 33 if the orientation of the blade is incorrect. At each point in time the actual angles of all the blades are known to the controller 30. This method is very accurate but places a heavy burden on data-transport and on the calculation capabilities.

Figure 6:
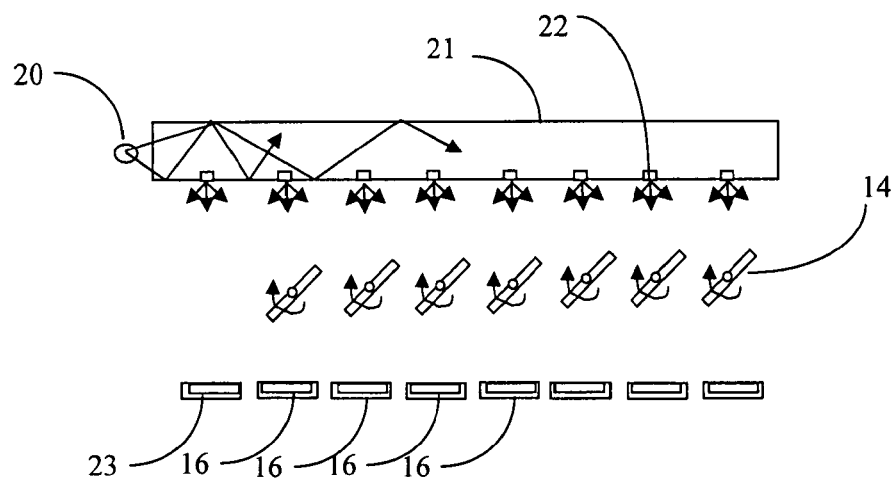
FIG. 6 is a diagram showing parts of the control arrangement of the attenuation control device.

As shown diagrammatically on the right hand side of FIG. 6 the radiation supplied to the vanes 14 for the purpose of detecting the orientation of the vanes 14 is supplied from a common radiation source 20, such as a LED and optionally by way of an optical fiber if the LED is positioned remotely, by way of an optical integrator 21 constituting a mixing unit having diffusely reflecting internal surfaces configured to mix the radiation from the common source 20. The mixed radiation is emitted from the optical integrator 21 through a respective aperture 22 towards each of the vanes 14. The row of apertures 22 follows the curved shape of the slit, and the radiation integrator itself can have any outer shape provided that all apertures 22 receive the same amount of randomized radiation. As previously described the quantity of radiation reaching the angle detector 16 is dependent on the orientation of the vane 14 as shown diagrammatically in FIG. 6. The optical integrator 21 has reflecting walls to multiply reflect radiation from the common source 20 towards the apertures 22, as shown diagrammatically in FIG. 6, and provides the required high homogeneity and stability with respect to drift over time and temperature to assure stable reproducible angle measurement. The attenuation control device also incorporates a reference detector 23 configured to provide a reference output signal in dependence on detection of a beam of detecting radiation reaching the reference detector directly from the common radiation source. The reference detector directly detects the radiation from the source and provides a reference output signal so that fluctuations of the radiation source, due to thermal drift, for example, can be compensated in an electronic control circuit.

While specific embodiments of the invention have been described above, it will be appreciated that the invention may be practiced otherwise than as described. The description is not intended to limit the invention.

The invention claimed is:

1. A lithographic apparatus comprising:
    an illumination system configured to condition a radiation beam;
    a support constructed to support a patterning device, the patterning device being constructed to impart a cross-sectional pattern to the radiation beam to form a patterned radiation beam;
    a substrate table constructed to hold a substrate;
    a projection system configured to project the patterned radiation beam onto a target portion of the substrate;
    an attenuation adjustment device comprising a plurality of members configured to cast penumbras in the radiation beam illuminating the patterning device; and
    an attenuation control device to adjust the members so as to control attenuation of the patterned radiation beam across the cross-section of the patterned radiation beam, the attenuation control device incorporating a position detector configured to provide an output indicative of the position of each member in dependence on detection of a beam of detecting radiation reaching the position detector after attenuation,
    wherein the attenuation control device incorporates a common radiation source configured to generate beams of detecting radiation to detect positions of the members.

2. The apparatus of claim 1, wherein the attenuation control device comprises a reference detector configured to provide a reference output in dependence on detection of a beam of detecting radiation reaching the reference detector from the common radiation source.

3. The apparatus of claim 1, wherein the attenuation control device comprises a mixing unit configured to receive detecting radiation from the common radiation source and to emit a beam of detecting radiation through an aperture in the unit towards each of the members.

4. The apparatus of claim 3, wherein the mixing unit has reflective walls configured to multiply reflect detecting radiation from the common radiation source towards the aperture.

5. The apparatus of claim 1, wherein the attenuation control device comprises a detection vane portion of each member spaced from a blade part of the member that casts a penumbra in the radiation beam illuminating the patterning device, the detection vane portion of each member configured to attenuate the beam of detecting radiation detected by the associated position detector.

6. The apparatus of claim 1, further comprising a scanning system configured to provide relative movement between the patterned radiation beam and the target portion of the substrate in a scanning direction, the members being distributed along a path transverse to the scanning direction.

7. The apparatus of claim 6, wherein the scanning system incorporates a curved slit extending along said path through which the patterned radiation beam is projected onto the target portion of the substrate, and the attenuation control device is adapted to adjust the members by different amounts in such a manner that the intensity of the patterned radiation beam is substantially constant over the length of the slit.

8. The apparatus of claim 6, wherein the attenuation control device is arranged to adjust the members in such a manner as to permit the intensity of the patterned radiation beam projected onto the target portion of the substrate to be varied in a direction transverse to the scanning direction and during the scanning.

9. The apparatus of claim 1, wherein the members of the attenuation control device are a series of blades that are tiltable about tilt axes so as to adjust the widths of the penumbras that they cast and are disposed with their tilt axes substantially parallel to one another.

10. The apparatus of claim 1, wherein the attenuation control device is configured to make use of feedback control to supply control signals to the members to drive the members to the required adjustment positions according to the output signals indicative of the positions of the members received from the position detectors.

11. A device manufacturing method comprising:
    imparting a cross-sectional pattern to a radiation beam using a patterning device to form a patterned radiation beam;
    casting penumbras on the patterning device using a plurality of members in the path of the radiation beam;
    providing an output indicative of the position of each member in dependence on detection of a beam of detecting radiation after attenuation, the beams of detecting radiation supplied from a common radiation source;
    adjusting the members based, at least in part, on the outputs to control attenuation of the patterned radiation beam across the cross-section of the patterned radiation beam; and
    projecting the patterned radiation beam onto a target portion of a substrate.

12. A lithographic apparatus comprising:
    an illumination system configured to condition a radiation beam;
    a support constructed to support a patterning device, the patterning device being constructed to impart a cross-sectional pattern to the radiation beam to form a patterned radiation beam;
    a substrate table constructed to hold a substrate;
    a projection system configured to project the patterned radiation beam onto a target portion of the substrate;
    an intensity adjustment device comprising a plurality of members configured to cast penumbras in the radiation beam illuminating the patterning device; and
    an attenuation control device to adjust the members so as to control the attenuation of the patterned radiation beam projected onto the target portion of the substrate across the cross-section of the patterned radiation beam, wherein at least one of the members has a transmitting region configured to transmit radiation located within a non-transmitting region of the member.

13. The apparatus of claim 12, wherein at least one of the members has a shape having sides that are not straight and/or not parallel to its axis of rotation.

14. The apparatus of claim 12, wherein at least one of the members has a three dimensional structure.

15. The apparatus of claim 12, wherein the attenuation control device comprises a position detector configured to provide an output indicative of the position of each member in dependence on detection of a beam of detecting radiation reaching the position detector after attenuation.

16. The apparatus of claim 15, wherein the attenuation control device comprises a common radiation source configured to generate beams of detecting radiation to detect the positions of the members.

17. The apparatus of claim 12, wherein the attenuation control device comprises a detection vane portion of each member spaced from a blade part of the member that casts a penumbra in the radiation beam illuminating the patterning device, the detection vane portion of each member configured to attenuate the beam of detecting radiation detected by the associated position detector.

18. The apparatus of claim 12, further comprising a scanning system configured to provide relative movement between the patterned radiation beam and the target portion of the substrate in a scanning direction, the members being distributed along a path transverse to the scanning direction.

19. The apparatus of claim 18, wherein the scanning system incorporates a curved slit extending along said path through which the patterned radiation beam is projected onto the target portion of the substrate, and the attenuation control device is adapted to adjust the members by different amounts in such a manner that the intensity of the patterned radiation beam is substantially constant over the length of the slit.

20. The apparatus of claim 18, wherein the attenuation control device is arranged to adjust the members in such a manner as to permit the intensity of the patterned radiation beam projected onto the target portion of the substrate to be varied both in the scanning direction and in a direction transverse to the scanning direction.

\* \* \* \* \*